United States Patent
Lee et al.

(10) Patent No.: US 9,840,609 B2
(45) Date of Patent: Dec. 12, 2017

(54) THERMOPLASTIC RESIN COMPOSITION FOR RADAR COVER

(71) Applicant: LG CHEM, LTD., Seoul (KR)

(72) Inventors: Su Min Lee, Daejeon (KR); Yeon Sik Choi, Daejeon (KR); Gi Dae Choi, Daejeon (KR); Chang Hun Yun, Daejeon (KR)

(73) Assignee: LG CHEM, LTD., Seoul (KR)

( * ) Notice: Subject to any disclaimer, the term of this patent is extended or adjusted under 35 U.S.C. 154(b) by 23 days.

(21) Appl. No.: 14/430,817

(22) PCT Filed: Dec. 5, 2014

(86) PCT No.: PCT/KR2014/011963
§ 371 (c)(1),
(2) Date: Mar. 24, 2015

(87) PCT Pub. No.: WO2015/084110
PCT Pub. Date: Jun. 11, 2015

(65) Prior Publication Data
US 2016/0355670 A1    Dec. 8, 2016

(30) Foreign Application Priority Data
Dec. 6, 2013   (KR) .................. 10-2013-0151848

(51) Int. Cl.
*C08K 7/24* (2006.01)
*C08K 3/04* (2006.01)
*H05K 9/00* (2006.01)
*C08L 77/02* (2006.01)
*C08L 77/06* (2006.01)
*H01Q 1/42* (2006.01)
*H01Q 17/00* (2006.01)
*H01Q 1/52* (2006.01)

(52) U.S. Cl.
CPC ............ *C08K 7/24* (2013.01); *C08K 3/04* (2013.01); *C08L 77/02* (2013.01); *C08L 77/06* (2013.01); *H01Q 1/42* (2013.01); *H01Q 1/526* (2013.01); *H01Q 17/002* (2013.01); *H01Q 17/004* (2013.01); *H05K 9/009* (2013.01); *C08K 2201/003* (2013.01); *C08K 2201/011* (2013.01)

(58) Field of Classification Search
CPC .. C08K 3/04; C08K 7/24; C08L 77/00; H05K 9/00
USPC ........................................................ 524/496
See application file for complete search history.

(56) References Cited

U.S. PATENT DOCUMENTS

| | | | |
|---|---|---|---|
| 6,528,572 B1 | 3/2003 | Patel et al. | |
| 6,762,237 B2 | 7/2004 | Glatkowski et al. | |
| 7,504,052 B2 | 3/2009 | Ehbing et al. | |
| 2003/0008123 A1 | 1/2003 | Glatkowski et al. | |
| 2003/0125478 A1* | 7/2003 | Mari Beek | C08L 71/123 525/397 |
| 2010/0003438 A1 | 1/2010 | Bryant et al. | |
| 2011/0155965 A1 | 6/2011 | Shin et al. | |
| 2013/0295308 A1 | 11/2013 | Kumazawa et al. | |
| 2014/0306164 A1 | 10/2014 | Restuccia et al. | |
| 2015/0005411 A1 | 1/2015 | Lee et al. | |

FOREIGN PATENT DOCUMENTS

| | | |
|---|---|---|
| EP | 1462817 A1 | 9/2004 |
| EP | 1777262 A1 | 4/2007 |
| EP | 2267078 A1 | 12/2010 |
| JP | 2002234950 A | 8/2002 |
| JP | 2005500648 A | 1/2005 |
| JP | 2005-298545 | * 10/2005 |
| KR | 20060052657 A | 5/2006 |
| KR | 20100058342 A | 6/2010 |
| KR | 1020100080419 A | 7/2010 |
| KR | 10201300833202 A | 7/2013 |
| WO | 2011064707 A2 | 6/2011 |
| WO | 2012098840 A1 | 7/2012 |
| WO | WO2012/153772 | * 11/2012 |
| WO | 2013141916 A2 | 9/2013 |

OTHER PUBLICATIONS

H. K. F. Cheng et al., "Complementary Effects of Multiwalled Carbon Nanotubes and Conductive Carbon Black on Polyamide 6", Journal of Polymer Science: Part B: Polymer Physics, 2010, vol. 48, p. 1203-1212.

* cited by examiner

Primary Examiner — Deve E Valdez
(74) Attorney, Agent, or Firm — Dentons US LLP

(57) ABSTRACT

Provided is a thermoplastic resin composition for a radar cover which exhibits excellent mechanical properties as well as a good balance between electromagnetic reflection loss and electromagnetic penetration loss, which is required for a radar protection, by including 85 wt % to 95 wt % of a thermoplastic resin, 1 wt % to 5 wt % of carbon nanotubes, and 3 wt % to 10 wt % of carbon black, wherein a weight ratio of the carbon nanotubes to the carbon black is in a range of 3:7 to 1:7.

16 Claims, No Drawings

THERMOPLASTIC RESIN COMPOSITION FOR RADAR COVER

This application is a National Stage Entry of International Application No. PCT/KR2014/011963, filed on Dec. 5, 2014, which claims priority to and the benefit of Korean Patent Application No. 10-2013-0151848, filed on Dec. 6, 2013, which are incorporated herein by reference in its entirety.

TECHNICAL FIELD

The present invention relates to a thermoplastic resin composition for a radar cover which protects a radar from the surrounding environment and simultaneously does not inhibit radar signal transmission.

BACKGROUND ART

Radar, as an acronym for "radio detection and ranging", is a wireless surveillance system which transmits electromagnetic waves in the high-frequency range (wavelength of 100 cm or less) to an object and receives electromagnetic waves reflected from the object to determine a distance to the object, direction, or altitude.

Radar initially has been used for military purposes such as search of a target, positioning, navigation, guidance, and bombing. Since its applicability has been extended through technological developments, radar currently has been used for the purpose of detecting the information relating to the altitude, speed, and position of an aircraft in aerospace engineering industry or determining the position of a ship and the position of an object in marine industry.

Also, recently, in line with the spread of an adaptive cruise control (ACC) technique for controlling a vehicle speed according to the speed of a vehicle ahead by sensing the vehicle ahead and a collision damage mitigation (CDM) technique for operating an automatic brake as well as giving an alarm to a driver when the collision between the vehicle ahead and the own vehicle is predicted, radar also has been used in automotive industry.

In line with the development of industries in which radar has been used as described above, radar is protected from the surrounding environment and moisture by mounting a radar cover on a front surface of the radar in order to effectively use the radar for an extended period of time. However, the radar cover mounted on the front surface of the radar causes electromagnetic wave loss due to the cover itself, and in particular, electromagnetic reflection loss on the surface of the radar cover may be very high.

Therefore, the radar cover must be made of a material capable of shielding transmitted electromagnetic waves at a predetermined level as well as having low electromagnetic reflection loss. That is, an electromagnetic wave shielding material having low reflection loss due to reflection as well as an appropriate electromagnetic wave shielding function may only be used as the radar cover.

However, in general, an electromagnetic wave shielding material, which is used in antenna manufacturing and reflectivity measurements, radar-tracking protection of aircrafts and ships, or absorption of electromagnetic waves of electronic devices, is a material capable of effectively reducing the intensity of electromagnetic waves by absorbing energy of the incident electromagnetic waves and converting their energy into heat using conduction, dielectric, and magnetic loss, i.e., a material with high penetration loss.

Thus, there is a need to develop a material for a radar cover which reduces the electromagnetic reflection loss and simultaneously does not inhibit radar signal transmission by controlling the shielding rate of the transmitted (penetrating) electromagnetic waves at an appropriate level.

Under the above-described background, while studying a material for a radar cover that protects a radar from the external environment and simultaneously does not inhibit radar signal transmission, the present inventors confirmed that a thermoplastic resin composition, in which carbon nanotubes and carbon black are added in optimal amounts and an optimal mixing weight ratio to a thermoplastic resin, has electromagnetic reflection loss and penetration loss characteristics to such a degree that does not inhibit radar signals while maintaining excellent mechanical properties, thereby leading to the completion of the present invention.

DISCLOSURE OF THE INVENTION

Technical Problem

The present invention provides a thermoplastic resin composition for a radar cover which protects a radar from the surrounding environment and simultaneously does not inhibit radar signal transmission.

The present invention also provides a radar cover which is manufactured from the thermoplastic resin composition to have excellent mechanical properties as well as a good balance between electromagnetic reflection loss and electromagnetic penetration loss which is required for radar protection, and a radar including the radar cover.

Technical Solution

According to an aspect of the present invention, there is provided a thermoplastic resin composition for a radar cover including 85 wt % to 95 wt % of (a) a thermoplastic resin; 1 wt % to 5 wt % of (b) carbon nanotubes; and 3 wt % to 10 wt % of (c) carbon black, wherein a weight ratio of the carbon nanotubes to the carbon black is in a range of 3:7 to 1:7.

According to another aspect of the present invention, there is provided a radar cover including a resin that is prepared from the thermoplastic resin composition, and a radar including the radar cover.

Advantageous Effects

Since a good balance between electromagnetic reflection loss and electromagnetic penetration loss which is required for radar protection as well as excellent mechanical properties may be obtained by using a thermoplastic resin composition for a radar cover according to the present invention, a radar cover that does not inhibit radar signals may be manufactured.

MODE FOR CARRYING OUT THE INVENTION

Hereinafter, the present invention will be described in more detail to allow for a clearer understanding of the present invention.

It will be understood that words or terms used in the specification and claims shall not be interpreted as the meaning defined in commonly used dictionaries. It will be further understood that the words or terms should be interpreted as having a meaning that is consistent with their meaning in the context of the relevant art and the technical idea of the invention, based on the principle that an inventor may properly define the meaning of the words or terms to best explain the invention.

The present invention provides a thermoplastic resin composition suitable for a radar cover because it has excellent mechanical properties as well as electromagnetic reflection loss and penetration loss characteristics which do not inhibit radar signal transmission.

Specifically, the thermoplastic resin composition for a radar cover according to an embodiment of the present invention includes 85 wt % to 95 wt % of (a) a thermoplastic resin; 1 wt % to 5 wt % of (b) carbon nanotubes; and 3 wt % to 10 wt % of (c) carbon black, wherein a weight ratio of the carbon nanotubes to the carbon black is in a range of 3:7 to 1:7.

Hereinafter, the present invention will be described in more detail.

(a) Thermoplastic Resin

In the thermoplastic resin composition for a radar cover according to the embodiment of the present invention, any thermoplastic resin may be used without particular limitation as long as it has thermoplasticity. Specifically, examples of the thermoplastic resin may be a polyamide resin, a polyimide resin, a polyamideimide resin, a polyacetal resin, a polycarbonate resin, a polyethersulfone resin, a polyether ketone resin, a polyetherimide resin, a polyalkylene terephthalate resin (e.g., polyethylene terephthalate, polybutylene terephthalate, etc.), an acryl-based resin, a polysulfone resin, a polyphenylene sulfide, a polyolefin (e.g., polyethylene, polypropylene, etc.), a polystyrene resin, a syndiotactic polystyrene resin, an acrylonitrile butadiene styrene resin, a polyphenylene oxide resin, and a liquid crystal polymer resin, and any one thereof, or a copolymer or mixture of two or more thereof may be used.

Among these materials, the thermoplastic resin, more specifically, may be a polyamide resin having excellent mechanical strength, wear resistance, heat resistance, and chemical resistance.

Also, the polyamide resin, more specifically, may have a melt index (MI) of 50 g/min to 65 g/min under conditions including a temperature of 300° C. and a load of 10 kg. In the case that the polyamide resin has a melt index within the above range, formability of the thermoplastic resin composition including the polyamide resin may be excellent.

The thermoplastic resin may be prepared according to a typical method known in the art without particular limitation, or a commercially available material may be purchased to be used as the thermoplastic resin. In the case that a polyamide resin is prepared to be used as the thermoplastic resin, although the present invention is not limited thereto, the polyamide resin, for example, may be prepared by homopolycondensation of a lactam with a ring structure having at least three members or ω-amino acid as a monomer, or by polycondensing two or more types thereof, and may be prepared by reacting diacids and diamine.

Furthermore, the polyamide resin may be a homopolyamide, a copolyamide, or a mixture thereof, and may be crystalline, semicrystalline, amorphous, or a mixture thereof.

Specifically, the polyamide resin may be a crystalline aliphatic polyamide such as polyamide 3, polyamide 4, polyamide 6, polyamide 7, polyamide 8, polyamide 9, polyamide 11, polyamide 12, polyamide 6,6, and polyamide 6,10; an amorphous copolyamide such as a copolymer of terephthalic acid or isophthalic acid, and hexamethylenediamine; or an aromatic polyamide such as polymethaxyleneadipamide, but the present invention is not limited thereto.

The thermoplastic resin may be included in an amount of 85 wt % to 95 wt % in the thermoplastic resin composition for a radar cover. In the case that the thermoplastic resin is included in an amount of less than 85 wt %, the formability and mechanical properties of the thermoplastic resin composition including the thermoplastic resin may deteriorate, and in the case in which the thermoplastic resin is included in an amount of greater than 95 wt %, amounts of carbon nanotubes and carbon black to be descried later are relatively decreased so that a desired electromagnetic shielding effect may not be obtained. Specifically, the thermoplastic resin may be included in an amount of 90 wt % to 95 wt %.

(b) Carbon Nanotubes

In the thermoplastic resin composition for a radar cover according to the embodiment of the present invention, the carbon nanotubes act to improve impact strength and tensile strength of the thermoplastic resin composition and simultaneously reduce the reflection loss. Also, since the carbon nanotubes may improve dielectric loss (or energy conversion loss) when electromagnetic waves are applied, the carbon nanotubes may exhibit excellent multi-absorbing capabilities with respect to the electromagnetic waves.

The carbon nanotubes denote fine molecules in which carbon atoms are grown in a long tubular form while constituting a round circle, wherein the carbon nanotubes has a hollow tubular structure in which one carbon atom is combined with three other carbon atoms to form a hexagonal honeycomb shape.

Also, the carbon nanotubes may have an average inner diameter of 0.5 nm to 10 nm, and more specifically, may have an average inner diameter of 1 nm to 5 nm.

Furthermore, the carbon nanotubes may include at least one selected from the group consisting of single-walled carbon nanotubes, double-walled carbon nanotubes, and multi-walled carbon nanotubes, but the present invention is not limited thereto.

The carbon nanotubes may reduce the reflection loss of the thermoplastic resin composition, but may increase the penetration loss when the amount thereof is excessively large. Accordingly, the amount of the carbon nanotubes may be appropriately controlled in consideration of the reflection loss and penetration loss of the thermoplastic resin composition. Specifically, the carbon nanotubes may be included in an amount of 1 wt % to 5 wt % in the thermoplastic resin composition for a radar cover, and more specifically, may be included in an amount of 1 wt % to 3 wt %. In the case that the carbon nanotubes are included in an amount of less than 1 wt %, an effect of reducing the reflection loss of the thermoplastic resin composition including the carbon nanotubes may be insignificant, and in the case in which the carbon nanotubes are included in an amount of greater than 5 wt %, the electromagnetic penetration loss may be excessively increased, or a desired electromagnetic penetration loss may not be obtained because the amount of carbon black to be described later is relatively decreased.

(c) Carbon Black

In the thermoplastic resin composition for a radar cover according to the embodiment of the present invention, the carbon black may act to improve the impact strength and tensile strength of the thermoplastic resin composition and simultaneously reduce the electromagnetic penetration loss.

The carbon black denotes fine carbon powder, wherein the carbon black may be spherical carbon powder having an average particle diameter ($D_{50}$) of 10 μm to 200 μm.

In the present invention, the average particle diameter ($D_{50}$) of the carbon black may be defined as a particle diameter at 50% in a cumulative particle diameter distribution. Also, the average particle diameter ($D_{50}$) of the carbon black, for example, may be measured by using a laser diffraction method, and more particularly, the carbon black is dispersed in a solvent, the resulting dispersion is introduced into a commercial laser diffraction particle size measurement instrument (e.g., Microtrac MT 3000) and irradiated with ultrasonic waves having a frequency of about 28 kHz and an output of 60 W, and the average particle diameter ($D_{50}$) at 50% in a cumulative particle diameter distribution of the measurement instrument may then be calculated.

The carbon black may be included in an amount of 3 wt % to 10 wt % in the thermoplastic resin composition for a radar cover. In the case that the carbon black is included in an amount of less than 3 wt %, an effect of reducing the electromagnetic penetration loss of the thermoplastic resin composition may be insignificant, and in the case in which the carbon black is included in an amount of greater than 10 wt %, the reflection loss may be excessively increased or a desired effect of reducing the reflection loss may not be obtained because the amount of the carbon nanotubes is decreased. Specifically, the carbon black may be included in an amount of 5 wt % to 7 wt %.

The thermoplastic resin composition for a radar cover according to the embodiment of the present invention includes the amount of the above-described each component in its optimal range, and simultaneously, may include (b) carbon nanotubes and (c) carbon black in which a mixing weight ratio of the (b) carbon nanotubes to the (c) carbon black is in a range of 3:7 to 1:7. In the case that the mixing weight ratio of the (b) carbon nanotubes to the (c) carbon black is outside the above range and the amount of the carbon nanotubes is excessively large, the penetration loss may be increased. Also, in the case in which the mixing weight ratio of the carbon nanotubes to the carbon black is outside the above range and the amount of the carbon black is excessively large, the reflection loss may be increased. Thus, in the case that the mixing weight ratio is not satisfied, an appropriate balance between the reflection loss and the penetration loss may not be maintained and it may be one-sided. As a result, radar signal transmission may be inhibited. Specifically, (b) carbon nanotubes and (c) carbon black may be included to the thermoplastic resin composition in a weight ratio of 1:3 to 1:7, more specifically, 1:7.

Also, the thermoplastic resin composition for a radar cover according to the embodiment of the present invention may include 1 part by weight to 5 parts by weight of the (b) carbon nanotubes and 5 parts by weight to 8 parts by weight of the (c) carbon black based on 100 parts by weight of the (a) polyamide resin. Specifically, the polyamide resin:carbon nanotubes:carbon black may be included at a weight ratio of 0.92:0.01:0.07.

According to another embodiment of the present invention, provided are a resin prepared by using the thermoplastic resin composition, a radar cover as a molded article including the resin, and furthermore, a radar including the radar cover.

The resin prepared by using the thermoplastic resin composition according to the embodiment of the present invention and the radar cover including the same may have a reflection loss of 2 dB to 9 dB and an electromagnetic interference shielding effectiveness (EMI SE) of 3 dB to 12 dB. Thus, the resin and the radar cover may not inhibit the radar signal transmission by exhibiting a good balance between the electromagnetic reflection loss and the electromagnetic penetration loss which is required for a radar cover. Specifically, the resin and the radar cover may have a reflection loss of 3 dB to 6 dB and an EMI SE of 3 dB to 5 dB.

Embodiment of the Invention

Hereinafter, the present invention will be described in more detail, according to the following examples and experimental examples. However, the following examples and experimental examples are merely presented to exemplify the present invention, and the scope of the present invention is not limited thereto.

Materials used in the following examples and comparative examples are as follows:

1) polyamide resin: a crystalline polyamide having a MI of 60 g/min under conditions including a temperature of 300° C. and a load of 10 kg
2) polycarbonate: average molecular weight ($M_w$)=21,000 g/mol, glass transition temperature (Tg)=150° C.
3) polybutylene terephthalate: $M_w$=24,000 g/mol, Tg=65° C.
4) polyphenylene sulfate: $M_w$=21,000 g/mol, Tg=90° C.
5) carbon nanotubes: double-walled carbon nanotubes having an average inner diameter of 2 nm
6) carbon black: average particle diameter ($D_{50}$) of 50 µm Example 1

94 g of a polyamide resin, 1 g of carbon nanotubes (multi-walled carbon nanotubes), and 5 g of carbon black were uniformly mixed and a thermoplastic resin sample (thickness: 3 mm) for a planar type radar cover was then prepared by using the resulting mixture with a twin screw extruder and an injection molding machine.

Example 2

A thermoplastic resin sample for a radar cover was prepared in the same manner as in Example 1 except that 92 g of a polyamide resin, 1 g of carbon nanotubes, and 7 g of carbon black were used.

Example 3

A thermoplastic resin sample for a radar cover was prepared in the same manner as in Example 1 except that 90 g of a polyamide resin, 3 g of carbon nanotubes, and 7 g of carbon black were used.

Comparative Example 1

A thermoplastic resin sample for a radar cover was prepared in the same manner as in Example 1 except that 94 g of a polyamide resin and 6 g of carbon nanotubes were used and carbon black was not used.

Comparative Example 2

A thermoplastic resin sample for a radar cover was prepared in the same manner as in Example 1 except that 90 g of a polyamide resin and 10 g of carbon nanotubes were used and carbon black was not used.

Comparative Example 3

A thermoplastic resin sample for a radar cover was prepared in the same manner as in Example 1 except that 94 g of a polyamide resin and 6 g of carbon black were used and carbon nanotubes were not used.

Comparative Example 4

A thermoplastic resin sample for a radar cover was prepared in the same manner as in Example 1 except that 90 g of a polyamide resin and 10 g of carbon black were used and carbon nanotubes were not used.

Comparative Example 5

A thermoplastic resin sample for a radar cover was prepared in the same manner as in Example 1 except that 91 g of a polyamide resin, 3 g of carbon nanotubes (multi-walled carbon nanotubes), and 6 g of carbon black were used.

Comparative Example 6

A thermoplastic resin sample for a radar cover was prepared in the same manner as in Example 1 except that 90 g of a polyamide resin, 1 g of carbon nanotubes (multi-walled carbon nanotubes), and 9 g of carbon black were used.

Comparative Example 7

A thermoplastic resin sample for a radar cover was prepared in the same manner as in Example 1 except that 86 g of a polyamide resin, 2 g of carbon nanotubes (multi-walled carbon nanotubes), and 12 g of carbon black were used.

Comparative Example 8

A thermoplastic resin sample for a radar cover was prepared in the same manner as in Example 1 except that 96 g of a polyamide resin, 0.5 g of carbon nanotubes (multi-walled carbon nanotubes), and 3.5 g of carbon black were used.

Comparative Example 9

A thermoplastic resin sample for a radar cover was prepared in the same manner as in Example 1 except that 87 g of a polyamide resin, 1 g of carbon nanotubes (multi-walled carbon nanotubes), and 12 g of carbon black were used.

Comparative Example 10

A thermoplastic resin sample for a radar cover was prepared in the same manner as in Example 1 except that 87.5 g of a polyamide resin, 0.5 g of carbon nanotubes (multi-walled carbon nanotubes), and 12 g of carbon black were used.

Comparative Example 11

A thermoplastic resin sample for a radar cover was prepared in the same manner as in Example 1 except that 92 g of a polyamide resin, 7 g of carbon nanotubes (multi-walled carbon nanotubes), and 1 g of carbon black were used.

Comparative Example 12

A thermoplastic resin sample for a radar cover was prepared in the same manner as in Example 1 except that 95 g of a polyamide resin and 5 g of carbon nanofibers were used and carbon nanotubes and carbon black were not used.

Comparative Example 13

A thermoplastic resin sample for a radar cover was prepared in the same manner as in Example 1 except that 92 g of a polyamide resin, 1 g of carbon nanotubes, and 7 g of carbon nanofibers were used.

Comparative Example 14

A thermoplastic resin sample for a radar cover was prepared in the same manner as in Example 1 except that 92 g of a polyamide resin, 7 g of carbon black, and 1 g of carbon nanofibers were used.

In Table 1 below, the materials used for preparing each sample of the examples and comparative examples and the amounts thereof are presented.

TABLE 1

| | Category | | | |
|---|---|---|---|---|
| | Polyamide (g) | Carbon nanotubes (g) | Carbon black (g) | Carbon nanofibers (g) |
| Example 1 | 94 | 1 | 5 | — |
| Example 2 | 92 | 1 | 7 | — |
| Example 3 | 90 | 3 | 7 | — |
| Comparative Example 1 | 94 | 6 | — | — |
| Comparative Example 2 | 90 | 10 | — | — |
| Comparative Example 3 | 94 | — | 6 | — |
| Comparative Example 4 | 90 | — | 10 | — |
| Comparative Example 5 | 91 | 3 | 6 | — |
| Comparative Example 6 | 90 | 1 | 9 | — |
| Comparative Example 7 | 86 | 2 | 12 | — |
| Comparative Example 8 | 96 | 0.5 | 3.5 | — |
| Comparative Example 9 | 87 | 1 | 12 | — |
| Comparative Example 10 | 87.5 | 0.5 | 12 | — |
| Comparative Example 11 | 92 | 7 | 1 | — |
| Comparative Example 12 | 95 | — | — | 5 |
| Comparative Example 13 | 92 | 1 | — | 7 |
| Comparative Example 14 | 92 | — | 7 | 1 |

Experimental Example 1

In order to comparatively analyze mechanical properties, electromagnetic reflection loss, and electromagnetic penetration loss of each sample prepared in the examples and comparative examples, respective characteristics were measured according to the following methods. The results thereof are presented in Table 2 below.

(1) Reflection loss and penetration loss: electromagnetic reflection loss and penetration loss of each sample were measured according to ASTM D4935.

Specifically, each sample (thickness: 3 mm) prepared in the examples and comparative examples was irradiated with electromagnetic waves with a frequency of 30 MHz to 1,500 MHz, and the reflection loss was then calculated from a difference between a signal intensity during the irradiation and a signal intensity that is reflected from the surface of the sample.

Also, each sample (thickness: 3 mm) prepared in the examples and comparative examples was irradiated with electromagnetic waves with a frequency of 30 MHz to 1,500 MHz, and the penetration loss was then calculated from a difference between a signal intensity during the irradiation and a signal intensity transmitted through the sample.

2) Tensile strength: tensile strength of each sample was measured according to ASTM D638.

3) Impact strength: impact strength of each sample was measured according to ASTM D256.

4) Surface resistance: surface resistance of each sample was measured according to ASTM D257.

TABLE 2

| | Category | | | | |
|---|---|---|---|---|---|
| | Reflection loss (dB) | Penetration loss (dB) | Tensile strength (MPa) | Impact strength (kg · cm/cm$^2$) | Surface resistance (Ω/sq) |
| Example 1 | 6 | 3 | 75 | 3.4 | 14.0 |
| Example 2 | 5 | 3 | 75 | 3.6 | 12.9 |
| Example 3 | 3 | 5 | 67 | 3.3 | 10.7 |
| Comparative Example 1 | 0.2 | 9.5 | 72 | 3.3 | 10.7 |
| Comparative Example 2 | 1 | 8 | 72 | 4.0 | 8.9 |
| Comparative Example 3 | 9 | 0.5 | 71 | 3.5 | 12.7 |
| Comparative Example 4 | 6 | 2 | 70 | 3.2 | 8.6 |
| Comparative Example 5 | 10 | 4 | 73 | 2.8 | 11.8 |
| Comparative Example 6 | 1.5 | 7 | 74 | 3.5 | 10.4 |
| Comparative Example 7 | 1 | 15 | 68 | 3.1 | 9.1 |
| Comparative Example 8 | 15 | 0.5 | 65 | 5.7 | 23.9 |
| Comparative Example 9 | 11 | 4 | 73 | 3.5 | 9.7 |
| Comparative Example 10 | 12 | 2 | 73 | 3.5 | 9.8 |
| Comparative Example 11 | 1 | 9 | 72 | 3.2 | 12.0 |
| Comparative Example 12 | 1 | 11 | 90 | 5.1 | 23.6 |
| Comparative Example 13 | 0.5 | 13 | 91 | 4.6 | 13.7 |
| Comparative Example 14 | 13 | 2.5 | 76 | 3.9 | 16.3 |

As illustrated in Table 2, the thermoplastic resin samples of Examples 1 to 3 prepared from the thermoplastic resin composition according to the present invention exhibited a good balance between the electromagnetic reflection loss and the electromagnetic penetration loss which is required for a radar protection while maintaining the same level of mechanical properties and surface resistance characteristics in comparison to the thermoplastic resin samples prepared in Comparative Examples 1 to 14.

Specifically, it was confirmed that the thermoplastic resin samples of Examples 1 to 3 simultaneously including the carbon nanotubes and the carbon black as well as the thermoplastic resin according to the present invention, exhibited characteristics, in which a good balance between the electromagnetic reflection loss and the electromagnetic penetration loss was maintained while not being one-sided, in comparison to the thermoplastic resin samples (Comparative Examples 1 to 4) including any one of the carbon nanotubes and the carbon black.

Also, in the thermoplastic resin composition according to the present invention, in the case that the range of the mixing weight ratio of the carbon nanotubes to the carbon black was not satisfied even if the carbon nanotubes and carbon black as well as the thermoplastic resin were included and the range of the amount of each component was satisfied (Comparative Examples 5 and 6), the samples had an effect which was biased to one of the electromagnetic reflection loss and penetration loss characteristics.

Furthermore, in the thermoplastic resin composition according to the present invention, in the case that the range of the amount of each component was not satisfied even if the carbon nanotubes and carbon black as well as the thermoplastic resin were included and the carbon nanotubes and carbon black were included at a mixing ratio satisfying the range of the mixing weight ratio (Comparative Examples 7 and 8), the samples had an effect which was biased to one of the electromagnetic reflection loss and penetration loss characteristics. In the case in which both the range of the amount of each component and the range of the mixing weight ratio of the carbon nanotubes to the carbon black were not satisfied (Comparative Examples 9, 10, and 11), the samples also had an effect which was biased to one of the electromagnetic reflection loss and penetration loss characteristics.

In the thermoplastic resin composition according to the present invention, a case of only using the carbon nanofibers instead of the carbon nanotubes or carbon black (Comparative Example 12), a case of using the carbon nanofibers and the carbon nanotubes by mixing at a mixing weight ratio of 7:1 (Comparative Example 13), and a case of using the carbon nanofibers and the carbon black by mixing at a mixing weight ratio of 1:7 (Comparative Example 14) all had an effect which was biased to one of the electromagnetic reflection loss and penetration loss characteristics.

From the above results, it may be understood that since the resin, which was prepared from the thermoplastic resin composition including the optimal amounts and mixing weight ratio of the thermoplastic resin, the carbon nanotubes, and the carbon black according to the present invention, exhibited a good balance between the electromagnetic reflection loss and the electromagnetic penetration loss which is required for a radar cover while maintaining excellent mechanical properties, the resin may not only protect a radar from the surrounding environment by being used in a radar cover, but may easily receive a reflected electromagnetic signal and does not inhibit the radar signal transmission by shielding only a predetermined level of the transmitted electromagnetic waves.

Experimental Example 2

In order to investigate an improvement effect in various thermoplastic resins, thermoplastic resin samples were prepared in the same manner as in Example 2 except that thermoplastic resins listed in the following Table 3 were used. Mechanical properties, electromagnetic reflection loss, and electromagnetic penetration loss of the prepared thermoplastic resin samples were measured in the same manner as in Experimental Example 1. The results thereof are presented in Table 3 below and are listed with the measurement results of the thermoplastic resin samples prepared in Example 2 in order to compare their effects.

TABLE 3

| Category | Thermoplastic resin type | Reflection loss (dB) | Penetration loss (dB) | Tensile strength (MPa) | Impact strength (kg · cm/cm$^2$) | Surface resistance (Ω/sq) |
|---|---|---|---|---|---|---|
| Example 2 | Polyamide resin | 5 | 3 | 75 | 3.6 | 12.9 |
| Example 4 | polycarbonate | 4 | 5 | 60 | 4.9 | 8.6 |
| Example 5 | Polybutylene terephthalate | 5 | 3 | 53 | 3.1 | 8.7 |
| Example 6 | Polyphenylene sulfide | 3 | 5 | 55 | 2.1 | 5.8 |

As illustrated in Table 3, even in the case in which the various thermoplastic resins were used, it was confirmed that a good balance between the electromagnetic reflection loss and the electromagnetic penetration loss which is required for a radar protection as well as excellent mechanical properties was obtained.

INDUSTRIAL APPLICABILITY

Since a thermoplastic resin composition for a radar cover according to the present invention exhibits excellent mechanical properties as well as a good balance between the electromagnetic reflection loss and the electromagnetic penetration loss which is required for a radar protection, the thermoplastic resin composition is suitable for the preparation of a radar cover that does not inhibit radar signals.

The invention claimed is:

1. A thermoplastic resin composition for a radar cover, the thermoplastic resin composition comprising:
   85 wt % to 95 wt %, relative to the total weight of the composition, of (a) a thermoplastic resin, wherein the (a) thermoplastic resin comprises a polyamide resin having a melt index of 50 g/min to 65 g/min under conditions including a temperature of 300° C. and a load of 10 kg;
   1 wt % to 5 wt %, relative to the total weight of the composition, of (b) carbon nanotubes; and
   3 wt % to 10 wt %, relative to the total weight of the composition, of (c) carbon black,
   wherein a weight ratio of the carbon nanotubes to the carbon black is in a range of 3:7 to 1:7, and
   wherein the (c) carbon black comprises spherical carbon particles having an average particle diameter ($D_{50}$) of 10 μm to 200 μm.

2. The thermoplastic resin composition for a radar cover of claim 1, wherein the (b) carbon nanotubes comprise any one selected from the group consisting of single-walled carbon nanotubes, double-walled carbon nanotubes, and multi-walled carbon nanotubes, or a mixture of two or more thereof.

3. The thermoplastic resin composition for a radar cover of claim 1, wherein the (b) carbon nanotubes have an average inner diameter of 0.5 nm to 10 nm.

4. The thermoplastic resin composition for a radar cover of claim 1, wherein the weight ratio of the (b) carbon nanotubes to the (c) carbon black is in a range of 1:3 to 1:7.

5. The thermoplastic resin composition for a radar cover of claim 1, wherein the thermoplastic resin composition comprises 1 part by weight to 5 parts by weight of the (b) carbon nanotubes and 5 parts by weight to 8 parts by weight of the (c) carbon black based on 100 parts by weight of the (a) thermoplastic resin.

6. A radar cover comprising a resin that is prepared from the thermoplastic resin composition of claim 1.

7. The radar cover of claim 6, wherein the resin has an electromagnetic reflection loss of 2 dB to 9 dB and an electromagnetic interference shielding effectiveness of 3 dB to 12 dB.

8. A radar comprising the radar cover of claim 6.

9. A thermoplastic resin composition for a radar cover, the thermoplastic resin composition comprising:
   85 wt % to 95 wt %, relative to the total weight of the composition, of (a) a thermoplastic resin, wherein the (a) thermoplastic resin comprises any one selected from the group consisting of a crystalline polyamide, a semicrystalline polyamide, and an amorphous polyamide, or a mixture of two or more thereof;
   1 wt % to 5 wt %, relative to the total weight of the composition, of (b) carbon nanotubes; and
   3 wt % to 10 wt %, relative to the total weight of the composition, of (c) carbon black,
   wherein a weight ratio of the carbon nanotubes to the carbon black is in a range of 3:7 to 1:7, and
   wherein the (c) carbon black comprises spherical carbon particles having an average particle diameter ($D_{50}$) of 10 μm to 200 μm.

10. The thermoplastic resin composition for a radar cover of claim 9, wherein the (b) carbon nanotubes comprise any one selected from the group consisting of single-walled carbon nanotubes, double-walled carbon nanotubes, and multi-walled carbon nanotubes, or a mixture of two or more thereof.

11. The thermoplastic resin composition for a radar cover of claim 9, wherein the (b) carbon nanotubes have an average inner diameter of 0.5 nm to 10 nm.

12. The thermoplastic resin composition for a radar cover of claim 9, wherein the weight ratio of the (b) carbon nanotubes to the (c) carbon black is in a range of 1:3 to 1:7.

13. The thermoplastic resin composition for a radar cover of claim 9, wherein the thermoplastic resin composition comprises 1 part by weight to 5 parts by weight of the (b) carbon nanotubes and 5 parts by weight to 8 parts by weight of the (c) carbon black based on 100 parts by weight of the (a) thermoplastic resin.

14. A radar cover comprising a resin that is prepared from the thermoplastic resin composition of claim 9.

15. The radar cover of claim 14, wherein the resin has an electromagnetic reflection loss of 2 dB to 9 dB and an electromagnetic interference shielding effectiveness of 3 dB to 12 dB.

16. A radar comprising the radar cover of claim 14.

* * * * *